(12) United States Patent
Pekarik et al.

(10) Patent No.: US 6,795,468 B2
(45) Date of Patent: Sep. 21, 2004

(54) ELECTRIC PUMPING OF RARE-EARTH-DOPED SILICON FOR OPTICAL EMISSION

(75) Inventors: John J. Pekarik, Underhill, VT (US); Walter J. Varhue, Georgia, VT (US)

(73) Assignee: Internatioal Business Machines Corporation, Armonk, NY (US)

( * ) Notice: Subject to any disclaimer, the term of this patent is extended or adjusted under 35 U.S.C. 154(b) by 0 days.

(21) Appl. No.: 10/461,919

(22) Filed: Jun. 16, 2003

(65) Prior Publication Data

US 2004/0037335 A1 Feb. 26, 2004

Related U.S. Application Data

(63) Continuation of application No. 09/030,455, filed on Feb. 25, 1998, now abandoned.

(51) Int. Cl.$^7$ ................................................ H01S 5/00
(52) U.S. Cl. ......................................... 372/44; 372/43
(58) Field of Search ...................................... 372/43–50

(56) References Cited

U.S. PATENT DOCUMENTS

| 4,967,251 A | 10/1990 | Tanaka et al. ................. 257/78 |
| 5,107,538 A | 4/1992 | Benton et al. ................. 385/130 |
| 5,119,460 A | 6/1992 | Bruce et al. ................... 385/142 |
| 5,248,890 A | 9/1993 | Luth et al. .................... 257/102 |
| 5,311,035 A | 5/1994 | Nire ............................ 257/15 |
| 5,369,524 A | 11/1994 | Pocholle et al. .............. 359/345 |
| 5,369,657 A | 11/1994 | Cho et al. .................... 372/39 |
| 5,438,639 A | 8/1995 | Ford et al. .................... 385/30 |
| 5,530,709 A | 6/1996 | Waarts et al. ................. 372/6 |
| 5,534,079 A | 7/1996 | Beach ......................... 148/33 |
| 5,580,663 A | 12/1996 | Campisano et al. ......... 428/446 |

FOREIGN PATENT DOCUMENTS

| DE | 3344 138 A1 | 6/1984 |
| EP | 0 517 440 B1 | 12/1994 |
| FR | 2 674 697 A1 | 10/1992 |
| JP | 62-029190 | 2/1987 |
| JP | 62-268169 | 11/1987 |
| JP | 5-175592 | 7/1993 |

OTHER PUBLICATIONS

Neamen, Donald, Semiconductor Physics and Devices, 1992 (no month available): R.R. Donnelley & Sons Company, USA, pp. 372–374.*

* cited by examiner

*Primary Examiner*—Quyen Leung
(74) *Attorney, Agent, or Firm*—Connolly Bove Lodge & Hutz LLP; William D. Sabo, Esq.; Larry J. Hume, Esq.

(57) ABSTRACT

A structure having a p-n junction in a semiconductor having a first p-type region and a first n-type region along with a region located in the vicinity of the p-n junction that is doped with a rare-earth element. In addition, the structure includes a charge source coupled to one of the p-type region and n-type region for providing charge carriers to excite atoms of the rare-earth element. Also provided is a method for producing the structure that includes providing a bipolar junction transistor; doping a region in a collector of the transistor with a rare-earth element; and biasing the transistor to generate light emission from the rare-earth element doped region.

11 Claims, 2 Drawing Sheets

ELECTRIC PUMPING OF RARE-EARTH-DOPED SILICON FOR OPTICAL EMISSION

CROSS-REFERENCE RELATED APPLICATION

The present application is a Continuation Application of Ser. No. 09/030,455 filed Feb. 25, 1998, abandoned.

DESCRIPTION

1. Technical Field

The present invention is concerned with a semiconductor structure that is especially useful in optical devices such as light emitting diodes (LED), lasers and light amplifiers. In particular, the present invention is concerned with a semiconductor structure that includes a rare-earth dopant.

2. Background Art

Optoelectronic devices convert optical signals into electrical signals and, conversely, convert electrical signals to optical signals in the form of photons of light emitted. In recent years, to a large extent optoelectronic devices depend on microelectronic devices. To a greater extent, optoelectronic components employ so-called III/V semiconductor elements for lasers, light emitting diodes and the like. Group III-V is semiconductors have as one element at least one member of the group IIIA of the periodic table (e.g. Al, Ga, In, Tl) and as a second element at least one member of the group VA of the periodic table (e.g. P, As, Sb and Bi). To a lesser extent, silicon-based devices have been used for such purposes. In view of the difficulties encountered in obtaining Si-based lasers, LEDs or amplifiers that operate at the commercially interesting wavelengths of about 1.3 to 2.5 µm. Nevertheless, it would be desirable to have Si-based optoelectro devices since the availability of these devices would greatly ease the difficulty of integrating optical and electronic functions on a single semiconductor chip. Moreover, the high thermal conductivity of silicon provides for certain operational advantages.

More recently, it has been found that doping of silicon with a rare-earth element such as erbium results in emitting light at wavelengths of about 1.5 µm under photo and electrical stimulation. Emission of light at this wavelength, which occurs via intra-4f level transitions of excited rare-earth element atoms, is desirable since it coincides with an absorption minimum of silica-based fibers.

Furthermore, electroluminescence has been demonstrated in both forward- and reverse-biased p-n junctions formed in erbium-oxygen-doped silicon as discussed in Stimmer et al, *Applied Phyics Letters*, Vol. 68, No. 23, June 1996, p. 3290. Under reverse-bias, the rare-earth atoms are excited by an Auger mechanism or impact ionization process. On the other hand, under forward-bias, the rare-earth atoms are excited by energy transferred from an electron-hole recombination event mediated by the interaction of the rare-earth atom with the silicon electronic structure. Use of such devices has been restricted since the electroluminescence is limited by low current densities in reverse-bias and by a strong (inverse) temperature dependence due to competing recombination mechanism in forward-bias. It would therefore be desirable to overcome these problems existent in the prior art.

SUMMARY OF INVENTION

The present invention provides a solution to the above-discussed problems. In particular, the present invention provides for a source of carriers to the device instead of relying upon the leakage current that is caused by impact ionization. More particularly, the present invention is concerned with a bipolar structure that comprises a p-n junction in a semiconductor having a first p-type region and a first n-type region. A region is located in the vicinity of the p-n junction that is doped with a rare-earth element. In addition, charge carrier means for exciting atoms of the rare-earth element is provided.

The present invention is also concerned with the method of producing such a device. In particular, the method of the present invention comprises providing a bipolar junction transistor; doping a region in a collector of the transistor with a rare-earth element; and biasing the transistor to generate light emission from the rare-earth element doped region.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BEST AND VARIOUS MODES FOR CARRYING OUT INVENTION

In order to facilitate an understanding of the present invention, reference will be made to the figures.

Figure 1:
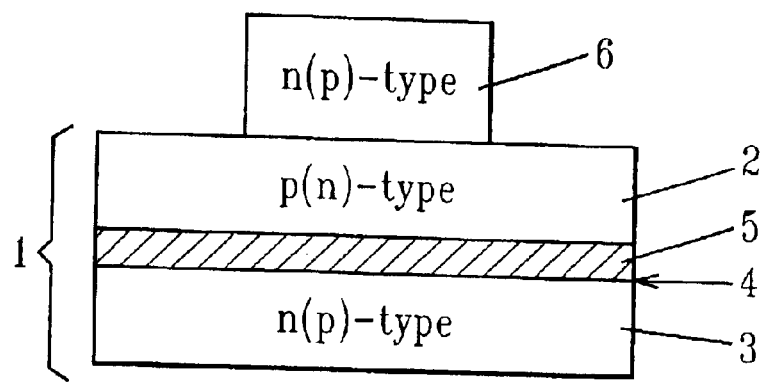
FIG. 1 is a schematic diagram of a bipolar transistor structure in accordance with the present invention.

According to the present invention, a semiconductor substrate 1 (see FIG. 1) such as silicon, germanium, diamond, alloys of such including silicon germanium and silicon carbide, and compound semiconductors including group II-VI such as zinc selenide and related materials, and group III-V such as gallium arsenide and related materials. The preferred semiconductor is silicon. The semiconductor substrate includes a first p-type or n-type region 2 and a first region 3 of the opposite conductivity type as region 2. In other words, when region 2 is p-type, then region 3 is n-type and vice versa. With respect to silicon p-type dopants include aluminum, gallium and indium. Typically the p-type region is doped with about $10^{15}$ to about $10^{20}$ and more typically from about $10^{17}$ to about $10^{19}$ atoms/cm$^3$ concentration. N-type dopants for silicon include phosphorous and arsenic. Typical dopant concentrations for the n-type dopant are about $10^{15}$ to about $10^{20}$ and more typical about $10^{17}$ to about $10^{19}$ atoms/cm$^3$.

Also, bipolar devices of the present invention include a p-n junction 4. Located in a region in the vicinity of the p-n junction is a region 5 doped with a rare-earth element. Suitable rare-earth elements include erbium praseodymium and neodymium, with erbium being preferred. Typically, the concentration of the rare-earth element is about $10^{15}$ to about $10^{20}$ atoms/cm$^3$ which can be incorporated into the structure during an epitaxial growth or be introduce by other techniques such as ion implantation.

Preferably, the region containing the rare earth element is a reverse biased junction and is the collector of a bipolar transistor.

Means 6 for injecting charge carriers to one of the p-type and n-type regions and preferably the p-type region to excite atoms of the rare-earth element is provided. This means can be a p-n junction coupled to one of the p-type and n-type regions (see FIG. 1). In a bipolar device, the pn-junction providing the charge is referred to as the emitter. As an alternative, an electron beam or light can be used for such purpose (see FIG. 4).

By placing the light emitting rare-earth-doped layer inside the reverse-bias collector junction, the competitive recombination that occurs inside a forward-biased junction is eliminated. Moreover, by having the emitter-base junction present, an independent control of the current density and electrical field is achieved, thereby providing a ready source of carriers with sufficient energy to excite the rare earth element via an impact ionization process.

Figure 2:
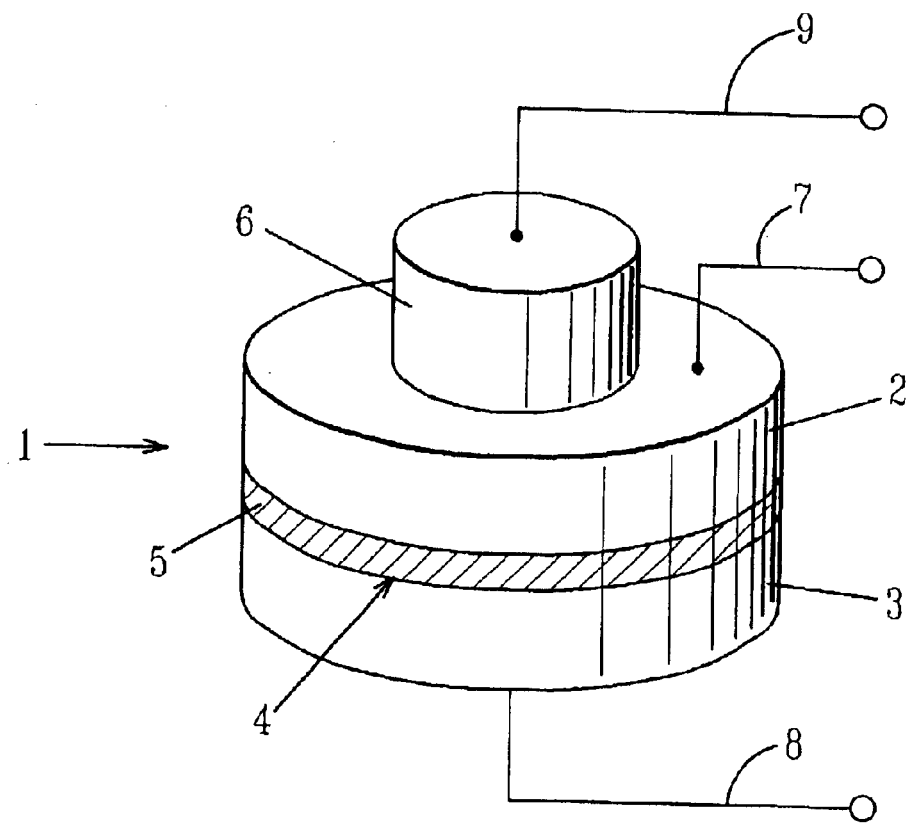
FIG. 2 is a schematic diagram of a LED structure in accordance with the present invention.

FIG. 2 illustrates a light emitting diode pursuant to the present invention including a semiconductor substrate 1, a first p-type or n-type region 2 and a first region 3 of the opposite conductivity type as region 2, a p-n junction 4 and a region 5 doped with a rare-earth element. A charge source 6 is electrically coupled to region 3. Electrical conductors 7, 8 and 9 are provided to regions 2, 3 and 6, respectively.

Figure 3:
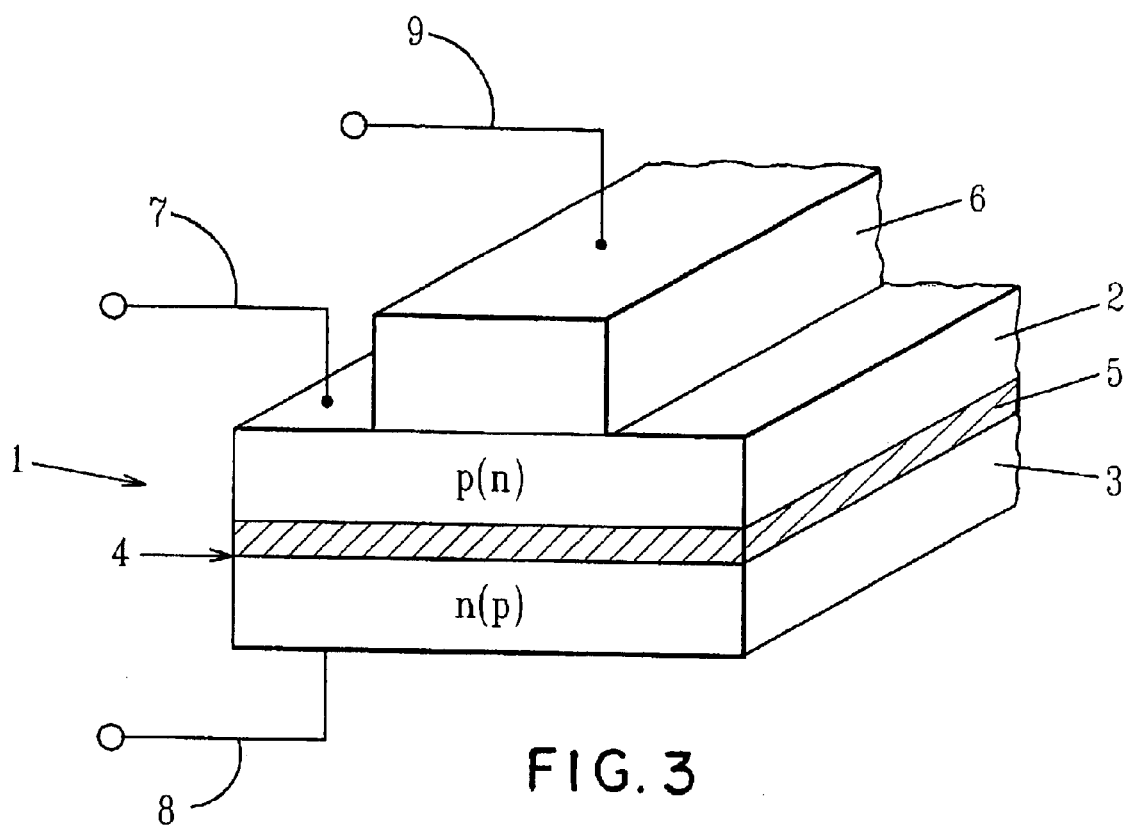
FIG. 3 is a schematic diagram of a laser or light amplifier in accordance with the present invention.

FIG. 3 illustrates a laser or light amplifier pursuant to the present invention including a semiconductor substrate 1, a first p-type or n-type region 2 and a first region 3 of the opposite conductivity type as region 2, a p-n junction 4 and a region 5 doped with a rare-earth element. A charge source 6 is electrically coupled to region 3. Electrical conductors 7, 8 and 9 are provided to regions 2, 3 and 6, respectively.

Figure 4:
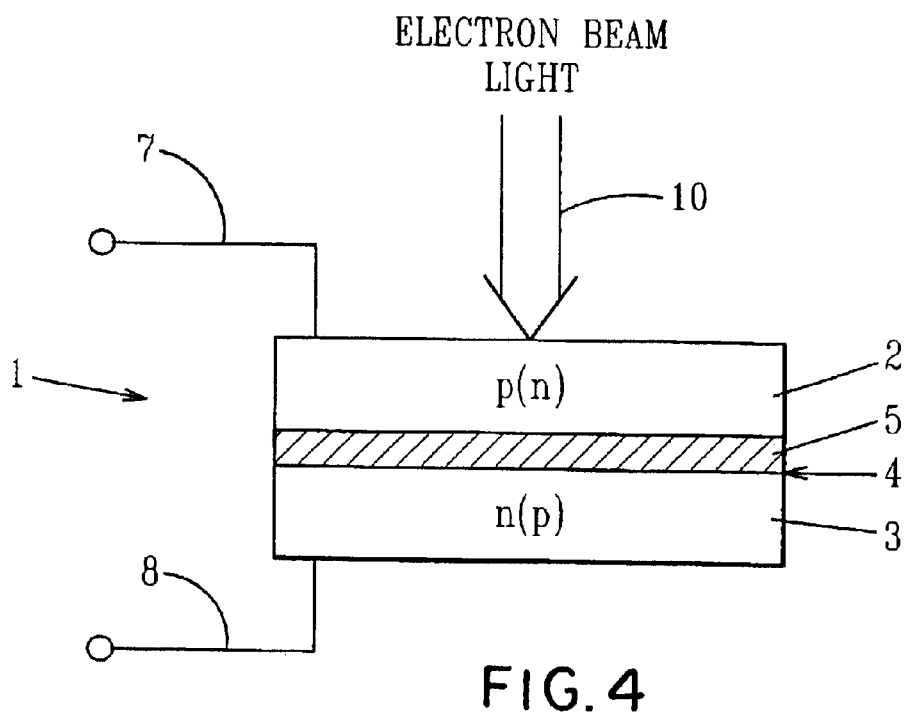
FIG. 4 is a schematic diagram of a structure in accordance with the present invention employing an alternative injection means for the charge carriers.

FIG. 4 illustrates a structure employing alternative injection means for the charge carriers pursuant to the present invention including a semiconductor substrate 1, a first p-type or n-type region 2 and a first region 3 of the opposite conductivity type as region 2, a p-n junction 4 and a region 5 doped with a rare-earth element. A charge source 10 of electron beam or light source is provided for injecting charge carriers to one of the doped regions 2 or 3. Electrical conductors 7 and 8 are provided to regions 2 and 3, respectively.

The foregoing description of the invention illustrates and describes the present invention. Additionally, the disclosure shows and describes only the preferred embodiments of the invention, but as aforementioned, it is to be understood that the invention is capable of use in various other combinations, modifications and environments and is capable of changes or modifications within the scope of the inventive concept as expressed herein, commensurate with the above teaching and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for producing an optoelectronic effect in a semiconductor structure, the method comprising:

providing a bipolar junction transistor;

doping a region in a collector of said bipolar junction transistor with a rare-earth element to a concentration in a range of $10^{15}$ to about $10^{20}$ atoms/cm$^3$;

reverse biasing the collector of said bipolar junction transistor; and biasing the transistor to generate light emission from the rare-earth element doped region.

2. The method of claim 1 wherein said rare-earth element is selected from the group consisting of erbium, praseodymium and neodymium.

3. The method of claim 1 wherein said rare-earth element is erbium.

4. The method of claim 1, further comprising:

injecting charge carriers through a forward-biased emitter-base region of the bipolar junction transistor, wherein the injected charge carriers are injected with an energy sufficient to excite the rare-earth element by impact ionization.

5. A method for producing light emission from a semiconductor device, the method comprising:

providing a bipolar junction transistor;

providing a dopant consisting of a rare-earth element in a collector region of said bipolar junction transistor;

reverse-biasing the collector region; and biasing the transistor to generate light emission from the rare-earth element doped region.

6. The method of claim 5, wherein the rare-earth element is provided in a concentration in a range of $10^{15}$ to about $10^{20}$ atoms/cm$^3$.

7. The method of claim 5, further comprising:

injecting charge carriers through a forward-biased emitter-base region of the bipolar junction transistor, wherein the injected charge carriers are injected with an energy sufficient to excite the rare-earth element by impact ionization.

8. A method for producing light emission from a semiconductor device, the method comprising:

providing a PN junction;

providing a dopant consisting of a rare-earth element in a region of the PN junction, wherein the dopant is provided in a concentration in a range of $10^{15}$ to about $10^{20}$ atoms/cm$^3$;

reverse-biasing the PN junction; and injecting charge carriers through the PN junction in response to an external stimulus impinging upon a surface of the device, wherein the injected charge carriers are injected with an energy sufficient to excite the rare-earth element by impact ionization.

9. The method of claim 8, wherein the external stimulus impinging upon the surface of the device is an electron beam.

10. The method of claim 8, wherein the external stimulus impinging upon the surface of the device is a light beam.

11. An arrangement for producing light emission, comprising:

a bipolar junction transistor having a collector region doped with a dopant consisting of a rare-earth element in a concentration in a range of $10^{15}$ to about $10^{20}$ atoms/cm$^3$;

bias means operatively connected to the collector region for reverse biasing the collector region and forward biasing an emitter-base region of the bipolar junction transistor, wherein the bias means injects charge carriers through the forward-biased emitter-base region with an energy sufficient to excite the rare-earth element by impact ionization.

* * * * *